United States Patent [19]

Blumenstock

[11] Patent Number: 4,908,935
[45] Date of Patent: Mar. 20, 1990

[54] METHOD FOR FABRICATING ELECTRONIC DEVICES

[75] Inventor: Brent J. Blumenstock, Trenton, N.J.

[73] Assignee: American Telephone and Telegraph Company, AT&T Bell Laboratories, Murray Hill, N.J.

[21] Appl. No.: 327,463
[22] Filed: Mar. 22, 1989
[51] Int. Cl.⁴ ............................................. H01R 43/00
[52] U.S. Cl. ...................................... 29/827; 174/52.2; 206/328; 264/264; 357/70
[58] Field of Search .......................... 29/827; 174/52.2; 357/70; 206/328, 331; 264/264, 272.17

[56] References Cited

U.S. PATENT DOCUMENTS

| | | | |
|---|---|---|---|
| 3,899,305 | 8/1975 | Hilgers | 29/827 X |
| 4,250,347 | 2/1981 | Fierkens | 174/52.2 |
| 4,271,588 | 6/1981 | Nowak | 29/827 |
| 4,396,796 | 8/1983 | Wong | 174/52 |
| 4,451,973 | 6/1984 | Tateno et al. | 174/52.2 X |
| 4,508,758 | 4/1985 | Wong | 427/96 |
| 4,552,818 | 11/1985 | Wong | 428/447 |
| 4,556,896 | 12/1985 | Meddles | 357/70 |

Primary Examiner—Carl J. Arbes
Attorney, Agent, or Firm—Roderick B. Anderson

[57] ABSTRACT

In a hybrid integrated circuit encapsulation process, each lead array (14) is encompassed by an elongated C-shaped barrier member (17) which clamps onto the portions of the lead array adjacent the substrate (11); that is, opposite sides of a slot (18) in the barrier member grasp opposite sides of the leads. Thereafter, the uncured RTV silicone (15) is dispensed onto the substrate, flows over and encompasses chips (12) mounted on the surface of the substrate and is prevented from flowing along the leads (14) by the C-shaped members (17), each of which, due to its configuration, constitutes a barrier to fluid flow, either along the length of the various leads or over the top of the C-shaped member. In one embodiment, levers (19) may be integrated onto the C-shaped member opposite the substrate to aid in prying open the slot to permit the leads to be easily inserted into the C-shaped member. In another embodiment, the C-shaped member (21, 22) is made of a plastic material, and integrated with an O-shaped member (23) which may be compressed by a pincer instrument (26) so as to open the slot (24) for easy insertion of the leads into the C-shaped member.

23 Claims, 3 Drawing Sheets

METHOD FOR FABRICATING ELECTRONIC DEVICES

TECHNICAL FIELD

This invention relates to the fabrication of electronic devices and, more particularly, to methods for encapsulating electronic devices with a viscous encapsulant that is subsequently hardened.

BACKGROUND OF THE INVENTION

As integrated circuit chips become more complex, increasing use is made of hybrid integrated circuit (HIC) technology, in which a ceramic substrate, upon which relatively complex printed circuitry can be formed, is used to support and interconnect one or more integrated circuit chips. The HIC is usually encased in a protective encapsulation. While this encapsulation may be a hard plastic package, increasing use is being made of silicone resins as an encapsulating medium.

As described, for example, in the U.S. patents of Wong, U.S. Pat. Nos. 4,508,758, granted Apr. 2, 1985, No. 4,396,796, granted Aug. 2, 1983, and No. 4,552,818, granted Nov. 12, 1985, each of which is assigned to a subsidiary company of the American Telephone and Telegraph Company, Inc., a particularly attractive encapsulate is known as RTV (for room temperature vulcanized) silicone. Such silicones are useful encapsulants because of their good thermal stability, good dielectric properties, chemical stability and resistance to atmospheric deterioration. In its uncured state, RTV silicone is fairly fluid and flows about semiconductor chips mounted on a ceramic substrate to completely encase such chips. If the chips are connected to the conductor pattern of the substrate by tiny bonding wires, RTV silicone is capable of flowing about such bonding wires and encasing them without breaking them. After curing, the silicone is sufficiently hard to protect the chips from the hazards of routine use as well as from atmospheric contaminants.

The printed circuit conductors on the surface of the ceramic substrate are typically terminated by lead conductors extending in a cantilever fashion from opposite sides of the substrate. When wired into a circuit, the leads typically constitute a mechanical support for the HIC as well as being electrical conductors.

Most of the assembly functions in modern electronic technology are performed by automated apparatus. Thus, for example, uncured silicone is dispensed onto a substrate surface as part of an assembly line operation, and it is intended that it initially be contained on the substrate by surface tension. After exposure to room temperature conditions for a few minutes, the RTV begins to cure, and after a longer time period, it reaches its final state of mechanical stability. One problem that has been confronted is the tendency of the uncured silicone to flow along the conductive leads and become hardened to the leads during subsequent cure. It is usually intended that the leads be free of contaminants and not insulated so that they can be conveniently and dependably connected to other apparatus such as printed wiring boards, again typically through automated procedures. Thus, silicone that has flowed onto the leads must normally be manually removed prior to subsequent processing.

Masking tape over the leads has been used to reduce the problem of silicone flow onto the leads, but has usually been found to be less than satisfactory. It is difficult to get a masking tape to adhere well to the individual leads without resort to an adhesive that would leave harmful contaminants on the leads after the tape is removed. Conventional masking tape employing a conventional adhesive tends to lift off from the leads at various locations prior to deposition of the silicone. We have found that the fluid silicone then tends to flow between the masking tape and the leads by capillary action at locations at which there is not complete adhesion of the tape to the leads. Even with complete adhesion, the silicone sometimes flows over the masking tape by capillary action, thereby tending to drain the surface of the substrate of the fluid silicone.

SUMMARY OF THE INVENTION

In accordance with the invention, the foregoing problems are solved in a hybrid integrated circuit encapsulation process in which each lead array is encompassed by an elongated C-shaped barrier member which clamps onto the portions of the lead array adjacent the substrate; that is, opposite sides of a slot in the barrier member grasps opposite sides of the leads. Thereafter, the uncured RTV silicone is dispensed onto the substrate, flows over and encompasses chips mounted on the surface of the substrate and is prevented from flowing along the leads by the C-shaped member which, due to its configuration, constitutes a barrier to fluid flow, either along the length of the various leads or over the top of the C-shaped member. In one embodiment, levers may be integrated onto the C-shaped member opposite the substrate to aid in prying open the slot to permit the leads to be easily inserted into the C-shaped member. In another embodiment, the C-shaped member is made of a plastic material, and integrated with an O-shaped member which may be compressed by a pincer instrument so as to open the slot for easy insertion of the leads into the C-shaped member.

These and other objects, features, and advantages of the invention will be better understood from a consideration of the following detailed description taken in conjunction with the accompanying drawing.

DETAILED DESCRIPTION

Figure 1:
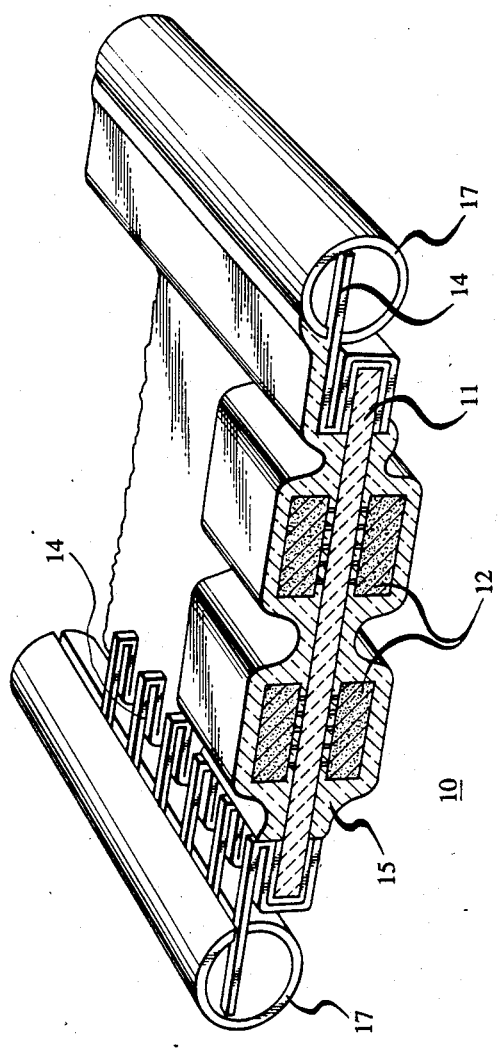
FIG. 1 is a perspective sectional view of part of a hybrid integrated circuit encapsulated with an RTV silicone in accordance with an illustrative embodiment of the invention.

Referring now to FIG. 1, there is shown a hybrid integrated circuit (HIC) 10 that is encapsulated in accordance with an illustrative embodiment of the invention. The HIC comprises a ceramic substrate 11 onto which are bonded a plurality of semiconductor chips 12. The chips are shown as being bonded to the substrate by a soldering method known as surface mounting, although wire bonding or other methods could be used.

Upon opposite major surfaces of the substrate 11 are defined printed electrical circuits (not shown) connecting the chips 12 with individual conductive leads 14. The leads are arranged in parallel arrays, with one array on each of two opposite sides of the substrate 11 as shown. In the typical modern HIC, there are many more leads extending from each side than those shown in FIG. 1; for example, one HIC with which the invention has been used has 36 leads extending from each of two sides of the substrate. After complete fabrication, the leads are typically bonded to a printed circuit board and constitute mechanical supports for the HIC, as well as interconnections between the chips 12 and other elements of an electronic system defined elsewhere on the printed circuit board.

The HIC circuit is encapsulated in a known manner by RTV silicone 15 which encases each of the chips and a major portion of the surface of the substrate 11. The silicone encapsulant is dispensed onto the substrate in a liquid form which is sufficiently fluid to flow around the chips and various other elements of the HIC. The extent to which it is necessary that the encapsulant cover the circuit pattern on the substrate surfaces will typically depend on the metal system used for defining the circuit pattern, and the environment in which it is intended to be used. After a sufficient exposure to room temperature and atmosphere, the silicone cures or solidifies so as to constitute a dependable encapsulation which protects the elements of the HIC during subsequent use. Various RTV silicones are known to have high dielectric properties, good thermal and chemical stability, and high resistance to atmospheric deterioration.

In accordance with the invention, prior to silicone dispensing, the lead arrays extending from opposite sides of the substrate 11 are both encased by C-shaped barrier members 17. As shown more clearly in FIG. 2, each C-shaped member of this embodiment is essentially a tube in which an elongated slot 18 parallel to the tube axis has been cut. The slot 18 is made to be about equal to the thickness of each of the leads 14 so that, when the leads are projected through the slot, the C-shaped member, due to its inherent elasticity grasps the leads on opposite sides thereof. The inner diameter of the tubular C-shaped member is made to be roughly equal to the length of each of the cantilever portions of the leads so that, when the leads are thoroughly projected into the member as shown in FIG. 1, the members grasp the leads at locations near the substrate 11.

It is intended that the silicone 15 be held on the surface of the HIC 10 by surface tension prior to cure. In its uncured state the silicone encapsulant is sufficiently fluid to flow about the chips 12 and other irregularities on the surface of the HIC substrate 11 but it has a fairly thick viscosity and, with proper calibration of the amount dispensed, little or no fluid silicone will run over the sides of the device. In the past, a serious flaw in this strategy has been that excess fluid silicone tends to flow along leads 14. The purpose of C-shaped barrier members 17 is of course to prevent this from happening and to contain the uncured fluid silicone on the surface of the HIC. As indicated in the drawing, both sides of the HIC will typically be encapsulated in this manner. That is, after the encapsulant on one side has cured sufficiently to adhere to the HIC against the force of gravity, the HIC is rotated so that silicone encapsulant can be deposited on the other side.

Figure 2:
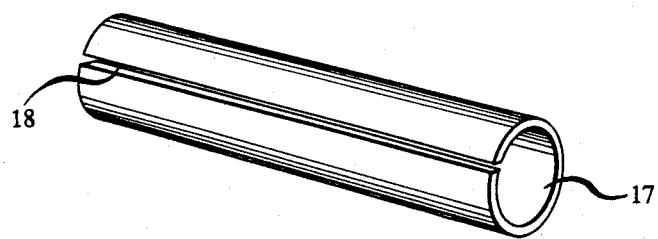
FIG. 2 is a perspective view of a C-shaped barrier member used in the arrangement of FIG. 1.

Referring to FIG. 2, the first experimental barrier members 17 that we made were made of TEFLON (a commercially available synthetic resin polymer product) having inner and outer diameters of 1/8 inch and 9/32 inches, respectively. The slot 18 was made manually with a razor blade, was quite ragged, and ranged in width from eleven mils up to as much as 50 mils. The thickness of the leads 14 on which the barrier member was fitted was eleven mils. In spite of a significant gap due to oversizing of part of the slot 18, the barrier member prevented any flow of silicone by capillary action along the leads 14. It is believed that this was because of a certain capillary action along the inner surface of the barrier member 17 which caused a small accumulation of silicone in the gap which in turn prevented flow along the length of the leads.

Also, even when an excess of silicone was purposely deposited on the HIC, such silicone did not flow over the top of the barrier member. This is because, with a tubular barrier member, the outer surface of the member extends at a large angle (nearly 90°) with respect to the lead array, which prevents silicone flow by capillary action; whereas, with masking tape there is no such barrier, and the silicone may flow over the top of the tape.

After this initial trial, barrier members were made with fifteen mil slots machined in 1/4 inch stock stainless steel tubing for use with eleven mil leads. The stainless steel tubing was likewise successful in masking the leads 14.

Figure 3:
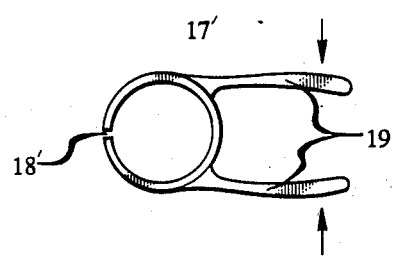
FIG. 3 is a sectional view of a C-shaped barrier member in accordance with an alternative embodiment of the invention.

Referring to FIG. 3, a C-shaped barrier member 17' may have an opening 18' which is just slightly smaller than the thickness of the leads to be inserted into the slot 18'. For example if the leads are eleven mils thick, the slot 18' may be ten miles wide. Then when the clamp is placed on the lead array, the elasticity of the clamp member 17', if it is made of a material such as TEFLON or stainless steel, will cause it to clamp firmly on the lead array, giving the structure more stability. Lever arms 19 (or wall portions) may be incorporated on the C-shaped member 17', as shown, to permit the slot 18' to be pried open for easier insertion of the lead array; that is, with forces on lever arms 19 as shown by the arrows, the slot 18' is pried open.

A later developed barrier member that has been made and used is the member 21 shown in FIG. 4 which is made of a plastic material such as polyethylene. The member has a C-shaped portion 22 integrated with a generally O-shaped portion 23. The slot 24 in the C-shaped portion is advantageously just slightly smaller than the thickness of the lead array it is to accommodate. As shown in FIG. 5, the slot 24 is pried open by using a pincer instrument 26 to squeeze and deform the O-shaped portion 23 as shown. That is, by providing forces to the lever arms 27 of the pincer instrument as shown by the arrows, opposite forces are directed to opposite sides of the O-shaped portion 23 so as to compress and deform it. This in turn puts a stress on the C-shaped portion 22 which causes slot 24 to be pried open as shown. The extent to which the slot 24 is pried open is exaggerated somewhat for purposes of illustration. With the element 21 being made of an appropriately elastic polyethylene material, it will resume the configuration shown in FIG. 4 after the pincer forces shown in FIG. 5 have been removed and firmly grasp the lead array within the C-shaped portion 22.

Figure 4:
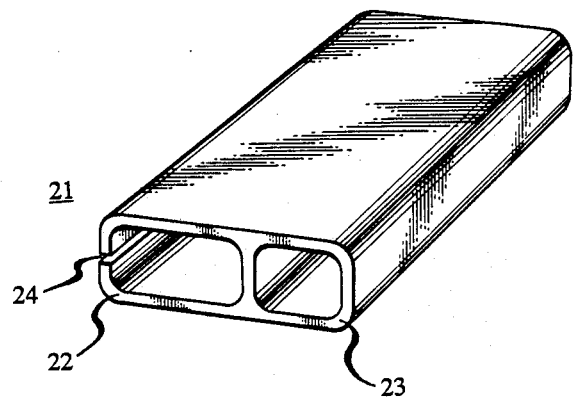
FIG. 4 is a perspective view of a C-shaped barrier member in accordance with still another embodiment of the invention.
Figure 5:
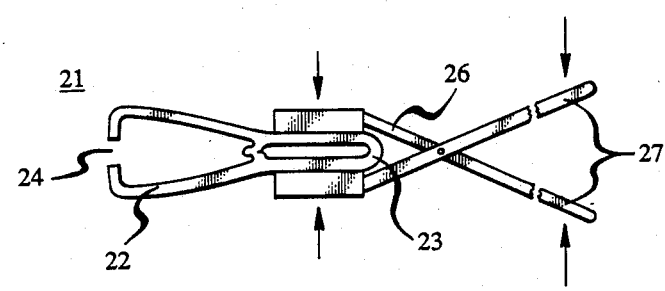
FIG. 5 is a view of the operation of a pincer instrument for compressing the member shown in FIG. 4.

The embodiment of FIG. 4 obviously lends itself to assembly line processing in that the leads can easily be inserted in slot 24. Further, the configuration of element 21 is such that it has generally flat top and bottom surfaces which permit it to be used as a spacer for permitting successive HICs to be stacked vertically so that the silicone can dry.

I have shown and described several embodiments of my invention for preventing RTV silicone from flowing along opposite lead arrays of a HIC during the encapsulation process. While it is preferred for purposes of mechanical stability that the C-shaped barrier members firmly clasp each lead of the lead array, it is not essential that there be such a clasping action as long as the gap between the clamping member and the individual lead is relatively small. I have found, for example, even with a gap as large as 20 mils, the barrier member will still prevent the flow of RTV silicone along the lead. However, because silicone will flow into such gap, it is preferred that the length of the gap be kept comparatively small and that the gap be kept near the substrate. The length of the gap is defined by the wall thickness of the C-shaped member that clamps on the lead array. Thus, it is preferred that the C-shaped member have an appropriately thin wall so as to clamp onto the lead array over an area of each lead that is much smaller than the total area of such lead and which is located near the substrate. The major portion of the lead, then, which extends beyond the gap into the barrier member, will be kept free of any silicone. One can appreciate that conventional masking is also provided by the barrier members; e.g., they protect the leads from splattering.

Any of various materials can be used for the barrier members, TEFLON, stainless steel and polyethylene being only typical examples which have been demonstrated. Also, the invention can be used with other encapsulants such as heat curable silicones, epoxies, and others that are applied in an initially fluid state. Various other embodiments and modifications may be made by those skilled in the art without departing from the spirit and scope of the invention.

I claim:

1. A method for encapsulating an electronic device having a substrate with at least one array of parallel leads having free ends extending from one side thereof in a cantilever fashion comprising the steps of depositing a quantity of initially fluid encapsulant on the substrate, the quantity of the encapsulant being sufficiently large to cover a major portion of one surface of the substrate, the encapsulant being contained on the one surface by surface tension, and thereafter hardening the encapsulant, characterized in that:

prior to the encapsulant deposit, the lead array is inserted into a slot in an elongated C-shaped member such that the free ends are enclosed by the C-shaped member, whereby the member prevents the encapsulant from contacting a major portion of the leads, and after the encapsulant has hardened, the C-shaped member is removed.

2. The method of claim 1 further characterized in that:

the C-shaped member defines a hollow C-shaped interior region into which the free ends of the array of leads extend;

and the lead array is inserted into the slot such that the C-shaped member grasps the lead array only at a location near the substrate.

3. The method of claim 2 further characterized in that:

the area of the lead array in contact with the C-shaped member is much smaller than the total area of the lead array.

4. The method of claim 3 further characterized in that:

the array of leads is arranged along a plane, and, after insertion of the lead array, the outer surface of the portion of the C-shaped member contacting the lead array extends at a large angle with respect to the plane, whereby said outer surface constitutes a barrier to the flow of the initially fluid encapsulant.

5. The method of claim 1 further characterized in that:

the array of leads is arranged along a plane, and the slot has a slightly smaller width (in a direction transverse to the plane) than the thickness (in a direction transverse to the plane) of the leads, whereby the step of inserting the lead array into the slots includes the step of opening the slot.

6. The method of claim 5 further characterized in that:

the step of opening the slot includes the step of exerting a force on the part of the C-shaped member opposite the slot.

7. The method of claim 6 further characterized in that:

the C-shaped member grasps the lead array on opposite sides thereof along a limited portion of such lead array adjacent the substrate.

8. The method of claim 2 further characterized in that:

the C-shaped member is made of TEFLON.

9. The method of claim 2 further characterized in that:

the C-shaped member is made of stainless steel.

10. The method of claim 2 further characterized in that:

the electronic device comprises at least one semiconductor chip mounted on one surface of a flat substrate;

and the encapsulant is sufficiently viscous to substantially completely encapsulate the semiconductor chip while being held on the surface of the substrate by surface tension.

11. The method of claim 10 further characterized in that:

two lead arrays extend from opposite sides of the substrates;

and each lead array is inserted in a separate C-shaped member.

12. The method of claim 2 further characterized in that:

the encapsulant is a silicone.

13. A method for making a hybrid integrated circuit comprising the steps of bonding at least one integrated circuit chip to a substrate having two arrays of leads, each array having a free end extending in cantilever fashion from one side of the substrate, interconnecting the integrated circuit chip with at least certain ones of the leads, depositing a quantity of initially fluid encapsulant on the substrate, and thereafter hardening the encapsulant, characterized in that:

prior to the encapsulant deposition, the free end of each lead array is inserted into a slot of a barrier member defining a hollow interior region into which a major portion of the length of each cantilevered lead extends;

and after the encapsulant has hardened the barrier members are removed.

14. The method of claim 13 further characterized in that:

the hollow interior region has a cylindrical shape with a diameter approximately equal to the length of the cantilever portion of each lead extending into it.

15. A method for encapsulating a semiconductor chip mounted on one surface of a flat substrate, the substrate supporting two arrays of parallel leads each having free ends extending from one side of the substrate in a cantilever fashion comprising the steps of: depositing a sufficient quantity of initially fluid encapsulant to cover a major portion of one surface of the substrate and being sufficiently viscous to substantially completely encapsulate the semiconductor chip while being held on the surface of the substrate by surface tension, and thereafter hardening the encapsulant, characterized in that:

prior to the encapsulant deposit, each lead array is inserted into the slot of a separate elongated C-shaped member defining a hollow interior region into which the free ends of the leads extend, whereby the member prevents encapsulant from contacting a major portion of the leads;

after the encapsulant has hardened, the substrate device is rotated 180 degrees and a quantity of second encapsulant is dispensed on the opposite side thereof;

and after the second encapsulant has hardened, the C-shaped members are removed.

16. The method of claim 14 further characterized in that:

the barrier member is made of TEFLON.

17. The method of claim 14 further characterized in that:

the barrier member is made of stainless steel.

18. The method of claim 14 further characterized in that:

the barrier member is made of polyethylene.

19. The method of claim 14 further characterized in that:

after the encapsulant has hardened and before the barrier members are removed, the hybrid integrated circuit device is rotated 180 degrees, and a quantity of encapsulant is deposited on the opposite side thereof.

20. The method of claim 15 further characterized in that:

the encapsulant is RTV silicone.

21. A method for making a hybrid integrated circuit comprising the steps of bonding at least one integrated circuit chip to a substrate having two arrays of leads each extending in cantilever fashion from opposite sides of the substrate, interconnecting the integrated circuit chip with at least certain ones of the leads, depositing a quantity of initially fluid encapsulant on the substrate, and thereafter hardening the encapsulant, characterized in that:

prior to the encapsulant deposition, each lead array is inserted into a slot of a barrier member defining a hollow interior region into which a major portion of the length of each cantilevered lead extends;

the lead array insertion steps each include the step of opening slightly the slot into which the lead array is inserted;

and after the encapsulant has hardened the barrier members are removed.

22. The method of claim 21 further characterized in that:

each barrier member comprises a tubular portion containing the slot, and wall portions extending from the tube portion opposite the slot;

and the step of opening the slot comprises the step of exerting forces on the wall portions.

23. The method of claim 22 further characterized in that:

the wall portions are part of a second tubular portion attached to the barrier member on the side of the barrier member opposite the slot;

and the step of exerting forces on the wall portions comprises the step of exerting forces on the second tubular portion.

* * * * *